(12) United States Patent
Koch et al.

(10) Patent No.: US 6,880,948 B2
(45) Date of Patent: Apr. 19, 2005

(54) ILLUMINANT AND METHOD

(75) Inventors: Gene C. Koch, Bayville, NJ (US); Charles M. Peterson, Sammamish, WA (US)

(73) Assignee: Zeolux Corporation, Sammamish, WA (US)

( * ) Notice: Subject to any disclaimer, the term of this patent is extended or adjusted under 35 U.S.C. 154(b) by 100 days.

(21) Appl. No.: 10/319,631

(22) Filed: Dec. 16, 2002

(65) Prior Publication Data

US 2004/0141302 A1 Jul. 22, 2004

(51) Int. Cl.[7] ................................................. F21V 7/04
(52) U.S. Cl. ............................................................ 362/31
(58) Field of Search ............................. 362/31; 385/146

(56) References Cited

U.S. PATENT DOCUMENTS 5,408,387 A * 4/1995 Murase et al. ................. 362/31
6,222,971 B1 * 4/2001 Veligdan et al. ............. 385/120
6,305,813 B1 * 10/2001 Lekson et al. ................. 362/31
2003/0184990 A1 * 10/2003 Lin ............................... 362/31
2003/0214720 A1 * 11/2003 Bourdelais et al. ......... 359/599

* cited by examiner

*Primary Examiner*—Stephen Husar
*Assistant Examiner*—James W Cranson
(74) *Attorney, Agent, or Firm*—Ronald D. Trice

(57) ABSTRACT

An illuminant that also functions as decorative wallpaper or as an architectural decoration is disclosed. The illuminant may include a light generation part such as an organic light emitting material, a light guide such as a tapered light guide, and a surface pattern. The light source generates the light that is guided to small opening in the surface pattern to provide illumination. The surface pattern may be formed as a decoration or subsequently processed to form the decoration.

31 Claims, 14 Drawing Sheets

ILLUMINANT AND METHOD

FIELD OF THE INVENTION

The present invention generally relates to an illuminant and method, and more particularly to an illuminant and method that may be used as wallpaper or an architectural decoration.

BACKGROUND

Buildings have many common structural elements. Among those elements are lighting fixtures and either wallpaper or wall decorations. Thus, wall or ceiling space is used by both the wallpaper or wall decoration and also by the lighting. A combination of a backlight with translucent wallpaper or wall decoration reduces the required wall or ceiling space but generates other problems. These problems include light absorption in the wallpaper or wall decoration that reduces the energy efficiency of the light source for a given illumination level and that the light absorption in the wallpaper or wall decoration alters the chromaticity of the light from the backlight. This absorption of light may produce undesired lighting effects such as a green wallpaper or wall decoration illuminating a room with green light. Accordingly there is a need for wallpaper and/or wall decorations that act as a self-luminous, energy efficient light source that does not have the above light absorption problems.

SUMMARY OF THE INVENTION

An aspect of the invention is to provide an illuminant including a surface pattern having a plurality of apertures and a light guide that guides light emitted from an organic light emitting material into the plurality of apertures. The light guide may be a tapered light guide, or may include microspheres, microlenses, zone plates or holographic lenses. The light guide may diverge the light. The organic light emitting element may have a predetermined illumination pattern or may have an illumination pattern that may be changed. The surface pattern may be a wallpaper pattern or an architectural decoration. The light guide includes a colored material that forms the surface pattern and may be adjacent a colored material. The surface pattern includes a clear resin.

Another aspect of the invention is to provide a method of making an illuminant including forming a light guide that guides light emitted from an organic light emitting material into a plurality of apertures of a surface pattern, and decorating the surface pattern with a colorant material such that a desired pattern results. The desired pattern may be decorative or functional. The desired pattern may be formed by dying the surface pattern. The desired pattern may be formed by printing a colored material on the surface pattern or may be formed from a photosensitive material. The photosensitive material may be a positive photosensitive material and may be developed by light emitted from the plurality of apertures.

Another aspect of the invention is to provide an illuminant including a surface pattern having a plurality of apertures and a light guide that guides light emitted from a light source into the plurality of apertures. The light guide may be a tapered light guide, or may include microspheres or microlenses. The light guide may diverge the light. The light emitting element may have a predetermined illumination pattern. The light emitting element may be an illumination pattern that may be changed. The surface pattern may be a wallpaper pattern or an architectural decoration. The light guide may include a colored material that forms the surface pattern and may be adjacent a colored material.

Another aspect of the invention is to provide a method of forming an illuminant including coating an array of tapered light guides with a negative photoresist, the array of tapered light guides having tips, passing light through the array of tapered light guides to illuminate a portion of the negative photoresist, developing the negative photoresist, depositing a material on the array of tapered light guides to form a layer, stripping the portion of the negative photoresist such that the layer adjacent the tips is removed, and depositing a resin after stripping the portion of the negative photoresist. The layer maybe a decorative layer that may be formed from a colored material and the depositing a material may be a metallization.

BRIEF DESCRIPTION OF THE DRAWINGS

The invention will be described in detail with reference to the following drawings in which like reference numerals refer to like elements wherein.

DETAILED DESCRIPTION

The combination of a light source, a sheet containing an array of microscopic light guides and a surface coloration element may be used to provide a wallpaper or wall decoration capable of simultaneously acting as an area lighting fixture. A light source, such as an organic light emitting diode light source, may be placed behind the sheet containing an array of microscopic light guides. The sheet diverges the light by channeling the light down to a small aperture that emits the light. The spaces between the apertures may be colored so as to provide a wallpaper pattern or a wall decoration. Since the channeled light does not pass through the surface coloration element that forms wallpaper pattern or wall decoration, light from the light source is not absorbed by the surface coloration element.

Figure 1:
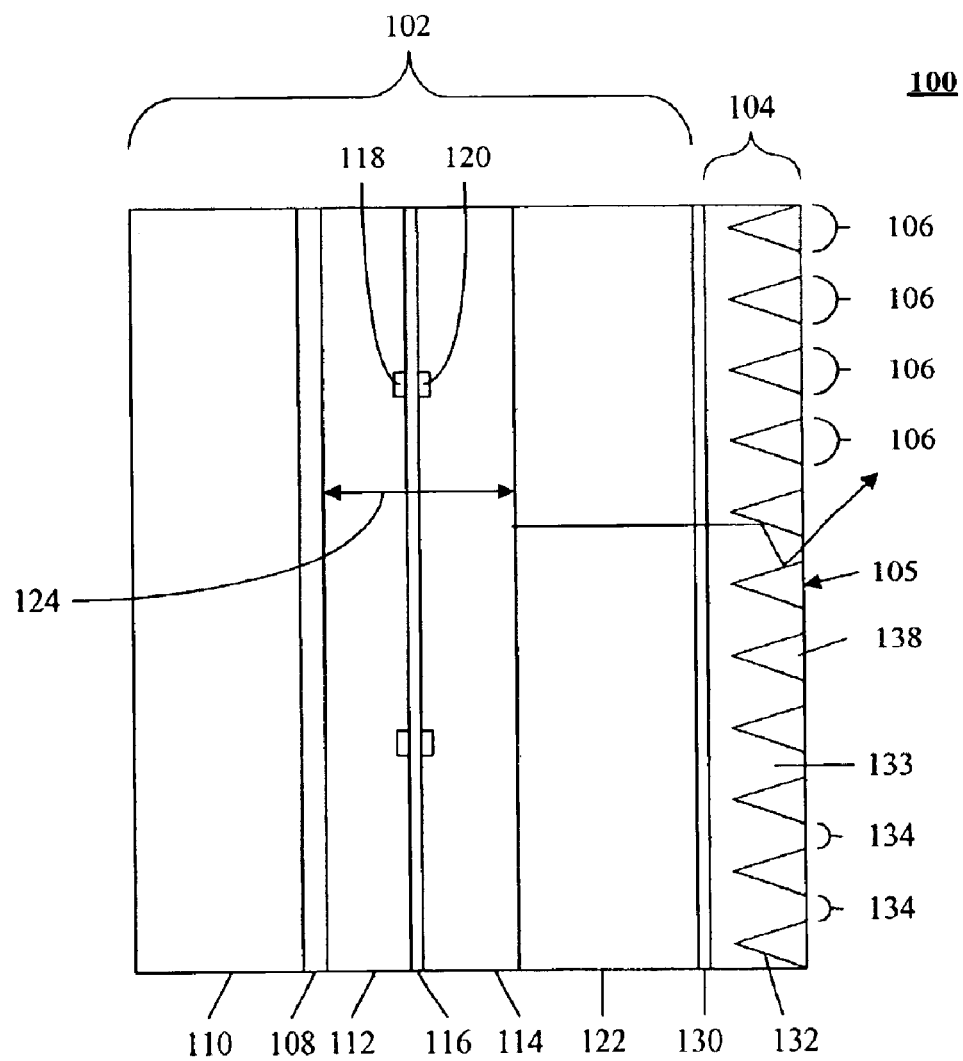
FIG. 1 illustrates an exemplary illuminant according to the present invention.

FIG. 1 illustrates an exemplary illuminant 100 according to the present invention The illuminant 100 includes a light generation part 102, a light diverging part 104, and a decorative or functional surface part 105 located in or on a non-light emitting area 106. Any suitable light source may be used for the light generation part 102. However, only a small amount of light will be lost in the illuminant 100 if the light generation part 102 is configured such that the light rays are collimated. For example, a feedback enhanced organic light emitting diode (FE-OLED) may be used for the light generation part 102. Such an organic light emitting diode light source may include a rear transparent substrate 110, a back feedback layer 112, a front feedback layer 114, an organic light emitting diode (OLED) 116, an anode bus 118, a cathode bus 120 and a front transparent substrate 122. The front feed back layer 114 and the back feedback layer 112 form a resonant cavity 124 that stimulates enhanced light emission in the organic light emitting diode 116 and renders the light rays substantially collimated. Further information and alternative embodiments for OLED light sources may be found in provisional application. Ser. No. 60/379, 141, which is incorporated herein by reference.

Figure 2:
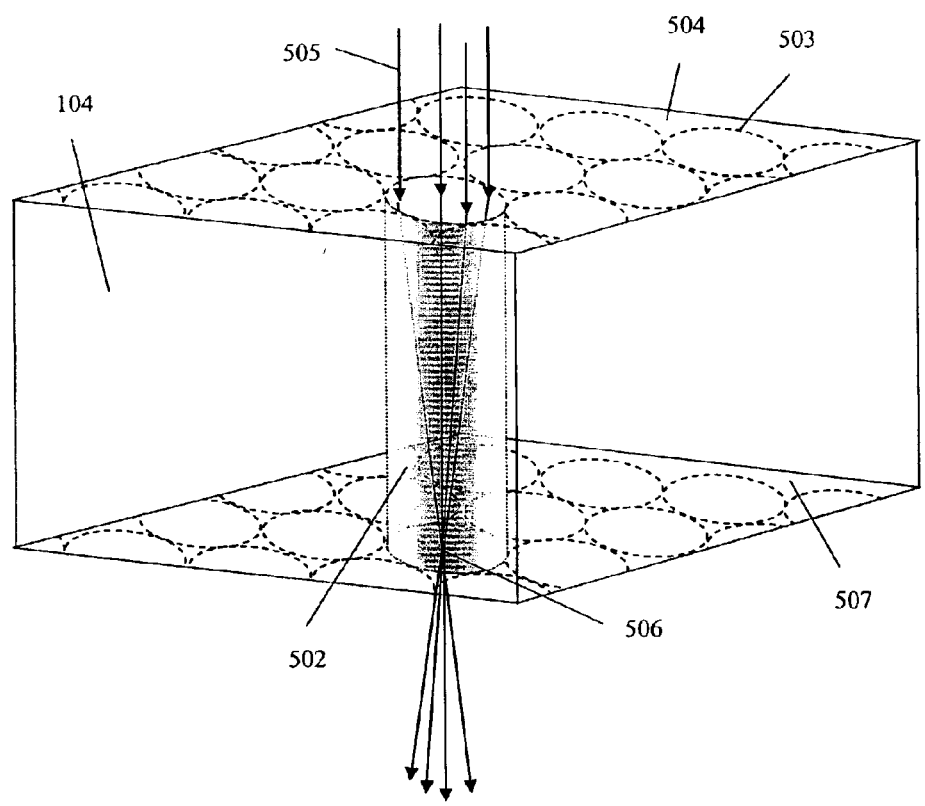
FIG. 2 illustrates another exemplary illuminant according to the present invention including circular cylinders.
Figure 3:
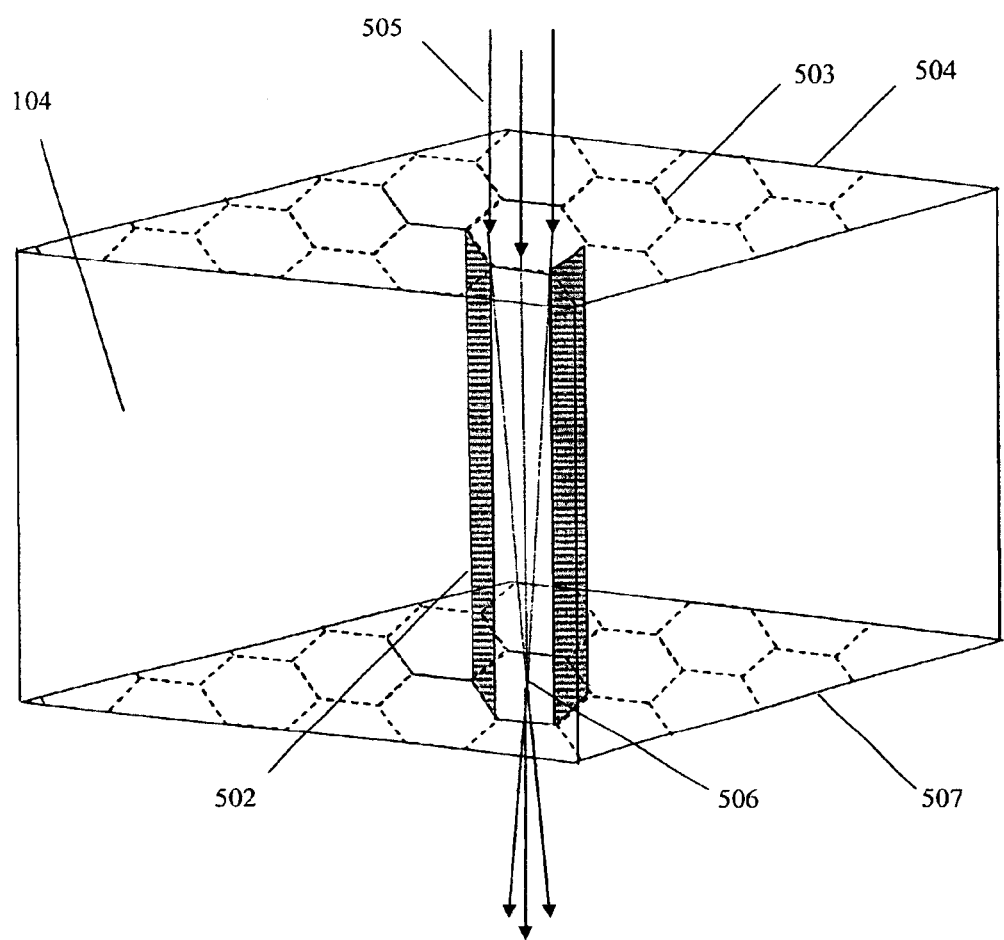
FIG. 3 illustrates another exemplary illuminant according to the present invention including octagonal cylinders.

The light diverging part 104 may be adhesively bonded to the light generation part 102 with an adhesive 130. The light from the light generation part 102 is incident upon the light diverging part 104. The light diverging part 104 is a sheet of material composed of an array of microscopic or near microscopic volumes or cells 502. The array of volumes or cells 502 may include interstitial volumes between them. The extent of the volumes is defined by an array of closed geometric FIG. 503 that tile to fill or nearly fill the surface area of the first or input surface 504 of the light diverging part 104 and the perpendicular or near perpendicular projection of those geometric figures down through the thickness of the light diverging part 104. A light guide array, microlens array or any other suitable means is provided within each volume to converge a pencil of light 505 entering the input surface 504 to a point or small area 506 on or proximate to the second or output surface 507 of the light diverging part 104. In some cases the point or area of convergence may not be within the corresponding microscopic volume. On exiting the point or area of convergence, the light once again diverges so that to an observer viewing the output surface 507 of the light diverging part 104, the output surface 507 appears to glow diffusely. In FIG. 2, the microscopic volumes are circular cylinders defined by circular areas. Alternatively, other generically cylindrical volumes defined by linearly and/or curvilinearly bound geometric figures on the input surface 504 or a mixture of two or more cylindrical types of microscopic volumes may be utilized. For example, FIG. 3 shows a light diverging part 104 comprising octagonal cylinders.

The light diverging part 104 may be a tapered photopolymerized waveguide array such as disclosed in U.S. Pat. No. 5,462,700. In this case the converging means are between the side walls 132 and form tapered light guides 133 that direct light received from the light generation part 102 through tapered light guides 133 to small apertures 134. The light is then emitted over a range of angles such that the light, if collimated or substantially collimated on entering the light diverging part 104, will be diverged over a range of angles thereby providing a light which may be viewed over the range of angles and which will illuminate over the range of angles. Exemplary configurations of a tapered light guide 133 are further discussed in U.S. Pat. Nos. 5,462,700, 5,481,385, 6,424,786, 5,657,408, and 5,696,865, all of which are incorporated herein by reference. Tapered light guides may be produced by the exemplary methods described in U.S. Pat. Nos. 3,218,924, 3,279,314, and 3,767, 445, all of which are incorporated herein by reference.

Figure 4:
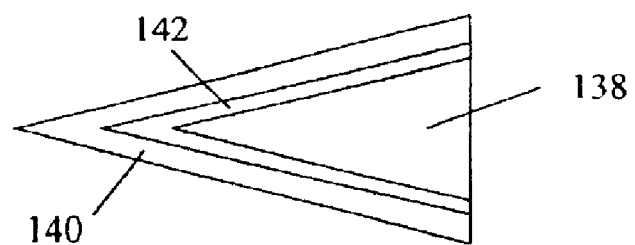
FIG. 4. illustrates an exemplary side wall and surface pattern configuration.

FIG. 4 illustrates an exemplary side wall 132. The light diverging part 104 has spaces 106 above the individual side walls 132. The side walls 132 may be a low index of refraction material, so as to provide a light guiding structure. Alternatively, the tapered light guides 133 may be coated with a low index material or otherwise suitably configured to provide the light guiding structure. Additionally, the decorative or functional surface part may be formed as part of the side walls 132 and/or on the light diverging sheet output surface 506 within the space 106. For example, a tapered light guide 133 may have a low index of refraction outer coating 140 to provide the wave guiding function. An opaque material 142 may then be deposited upon the low index of refraction coating 140. The remainder of the side walls 132 not filled by the opaque material 142 then may be filled with the colored material 138 that functions as the decorative or functional part. The opaque material 142 is below the viewed surface and the colored material 138 is on the viewed surface. FIG. 4 illustrates an exemplary embodiment having this structure. Alternatively, the opaque material 142 may be omitted and the remainder of the space may be solely filled by the colored material 138. Alternatively, the opaque material 142 may have a low index of refraction and the low index of refraction outer coating 140 may be omitted. Alternatively, the colored material 138 that constitutes the decorative or functional part may have a sufficiently low index that colored material 138 alone may be used to form the side walls 132. The colored material 138 may function as a low index cladding for the tapered light guide 133.

Figure 5:
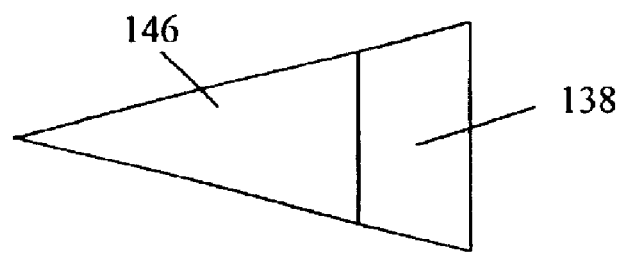
FIG. 5. illustrates another exemplary side wall and surface pattern configuration.

FIG. 5. illustrates another exemplary side wall 132 and surface pattern configuration. In FIG. 5, the side wall 132 is partly formed from with the low index of refraction material 146 then the remaining portion is formed from a colored material 138. Another alternative is to completely form side walls 132 with a low index of refraction material 146 and then impregnate the surface part of the side walls 132 to form the colored material 138. In this case, the low index of refraction material 146 must be able to receive the dye or pigment or other colorant to form the colored material 138 subsequent to deposition.

Figure 6:
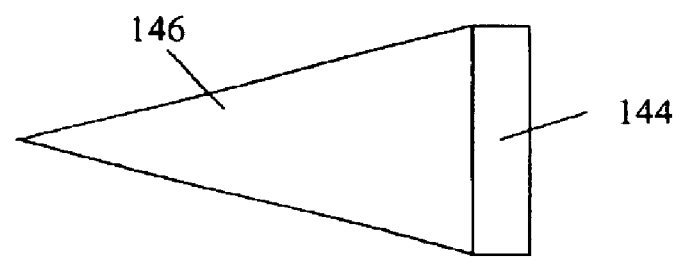
FIG. 6. illustrates a third exemplary side wall and surface pattern configuration.

FIG. 6. illustrates a third exemplary side wall 132 and surface pattern configuration. In FIG. 6, the side wall 132 is completely formed from the low index of refraction material 146 and a colored material 144 formed or coated thereon. Alternatively, the colored material 144 may be colored subsequent to deposition. The colored material 144 may be deposited as colored material or may be deposited as a pigment receiving material which is dyed or otherwise colored subsequent to the deposition of the pigment receiving material. A desired pattern may be formed by dying the surface pattern or by printing a colored material on the surface pattern. The desired pattern may be formed from a photosensitive material, such as a positive photosensitive material. The material is chosen to have the desired decorative color either by containing dissolved dye or by being filled with pigment. The positive photosensitive material may be exposed by light emitted from the plurality of apertures. This light may be from energizing the light source 102 or some other light source located behind input surface 504 for this purpose. Following this the photosensitive material is developed with a suitable solvent leaving a film of the material over the spaces 106, but not over the tapered light guides 132. The photosensitive material may screen printed onto the light diverging sheet in some decorative pattern, exposed, and then developed as above. This procedure may then be repeated one or more times to build up a multicolored, decorative pattern over the ensemble of spaces 106. Alternatively, the positive photosensitive material may be coated uniformly on the output surface 506 of the light diverging sheet 104. The material then may be exposed by light directed towards the output side of the light diverging sheet through a photomask. Subsequently the material can be exposed with illumination from light generation part 102. Development of the photoresist then yields a decoratively patterned film with the desired apertures 134 between the side walls 132. These steps may be repeated to build up a multicolored decorative pattern. Alternatively, a negative photosensitive patterning material may be deposited and then exposed by turning on the light generation part 102 or some other light source located behind input surface 504 for this purpose. The exposed pattern is then developed removing unexposed patterning material. The colored material 144 is then deposited. If the deposition is such that the colored material 144 will flow into the holes where the unexposed patterning material is removed and not wet the patterning material surface, no colored material 144 need be removed. If the deposition is such that the colored material 144 remains on the patterning material surface, the excess material may need to be removed. This removal may be by sqeegeeing, wiping, or any other suitable technique. If the photosensitive material is transparent to the light produced by the light generation part 102 it may be left in place. Otherwise photosensitive material may be chemically stripped. The unwanted colored material also may be removed by a lift process whereby the photosensitive material is chemically stripped with the colored material over the photosensitive material. This removes both the photosensitive material and the colored material. This approach may be particularly advantageous if the colored material is a vacuum deposited metal coating because it provides a way to selectively remove the tenacious metal film from the tapered light guide exit apertures.

If the decorative, colored material 138 is transparent or translucent, it is advantageous to use the configuration in FIG. 4 wherein the opaque layer 142 is a white pigment loaded material or that shown in FIG. 5 wherein the low index material 146 is loaded with a white pigment. In this way the decorative patterning will be made more brilliant to the eye. Additionally, white background areas in a decorative pattern may be formed by using the configuration of FIG. 4 wherein the opaque layer 142 is white pigment loaded and the material 138 is a clear resin or the configuration in FIG. 5 wherein the low index material 146 is loaded with a white pigment and material 138 is a clear resin.

Figure 7:
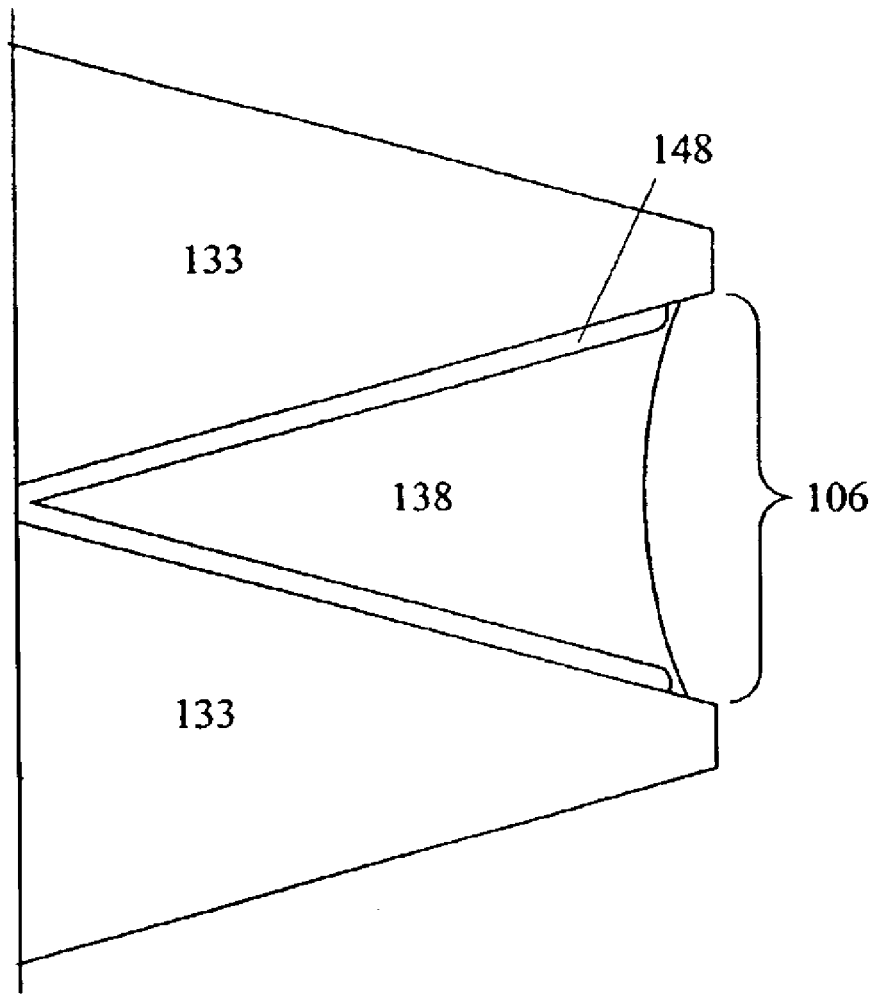
FIG. 7 illustrates a fourth exemplary side wall and surface pattern configuration.

FIG. 7 illustrates a fourth exemplary side wall 132 and surface pattern configuration. In FIG. 7 the light guide surfaces of the tapered light guide 133 are coated with a vacuum deposited metal coating 148. After the metal coating is applied the remainder of the side wall 132 is filled with a transparent and/or translucent resin 138. This resin may or may not be colored.

Figure 8:
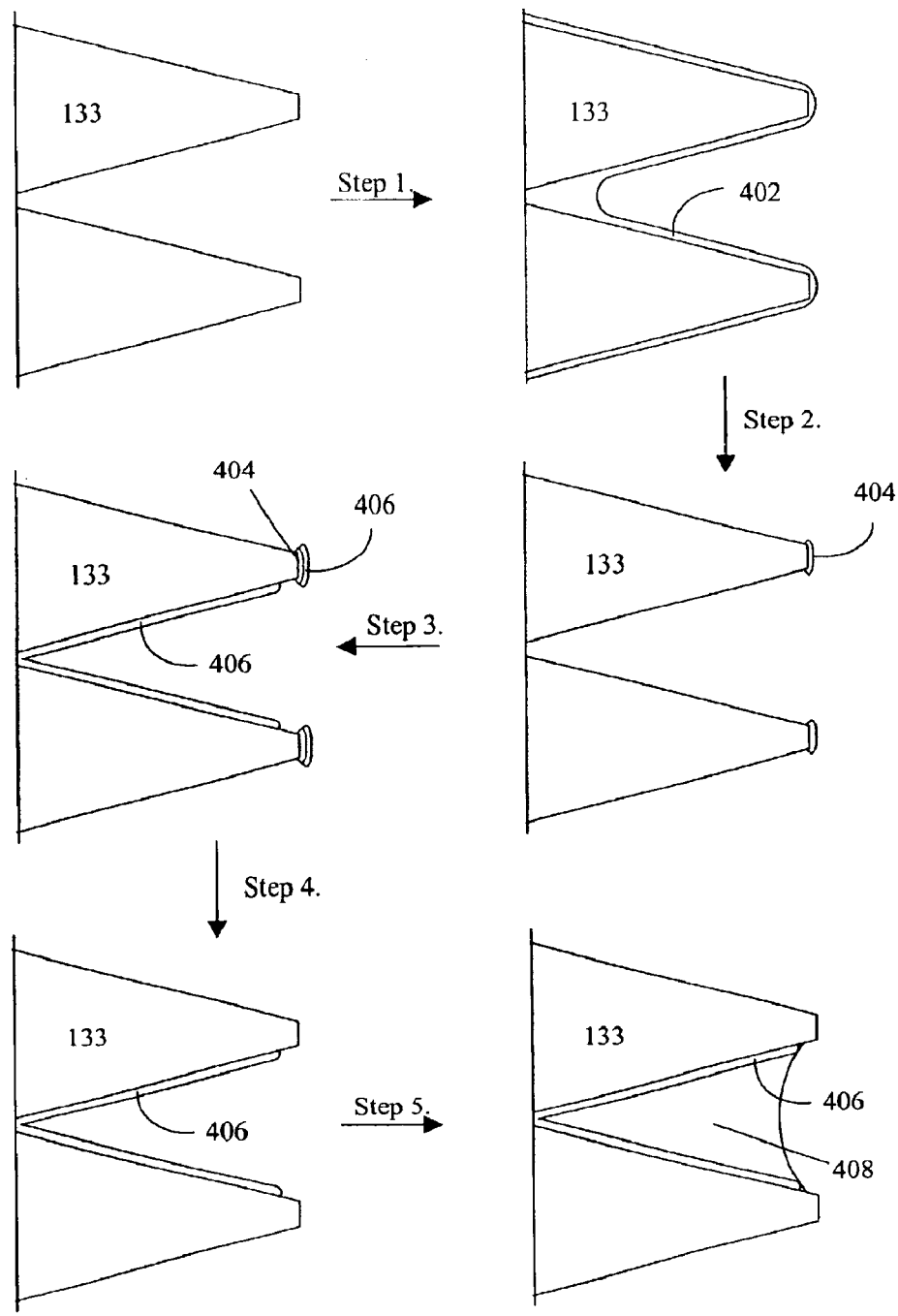
FIG. 8 illustrates an exemplary method of forming the side wall of FIG. 7.

FIG. 8 illustrates an exemplary method of forming the side wall 132 of FIG. 7. In Step 1, an array of tapered light guides 133 are coated with a negative photoresist 402. In Step 2, light is passed through the light diverging part 104 from the input surface. This causes a high luminous flux to be emitted from the tips of the tapered light guides 133 polymerizing the photoresist 402. The photoresist 402 is then developed leaving the light channels tips alone covered by the remaining photoresist 404. In Step 3, the array of tapered light guides 133 is vacuum metallized to form a metallic layer 406. In Step 4, the remaining photoresist 404 is chemically stripped which also removes the metallization at the tips of the tapered light guides 133. In Step 5, the illuminant 100 is completed by coating a transparent resin 408 to complete the side walls 132.

An alternative method of fabricating the light diverging sheet 104 containing side walls 132 and tapered light guides 133 may be found in U.S. Pat. No. 5,462,700 which teaches the fabrication of arrays tapered micro-light guides by patterned exposures of films of photopolymerizable materials. Black filled rear projection screens may be produced from those arrays by rubbing carbon filled fluorocarbon prepolymer into the spaces between the tapered light guides 133. Next, excess carbon loaded fluorocarbon is cleaned from the tips of the tapered light guides 133 by a simple wiping procedure. The fluorocarbon is then cured at elevated temperatures. Alternatively, the carbon loaded fluorocarbon material may be deposited into the voids between the tapered light guides 133 by blade coating. This process may be automated to produce the screen material on a roll to roll basis. Similarly, blade coating may be used to fill the voids between the tapered light guides 133 with fluorocarbon prepolymer that has been filled with colored pigments or fluorocarbon prepolymer that contains a dissolved colored dye or an unfilled fluorocarbon prepolymer. Alternatively, blade coating may be used to deposit a smaller amount of clear fluorocarbon prepolymer in the voids between the tapered light guides 133. After this material has been cured, a second layer of colored fluorocarbon prepolymer may be coated to fill the remaining volume in the voids and then cured. The resultant structure similar to that illustrated in FIG. 5.

Figure 9:
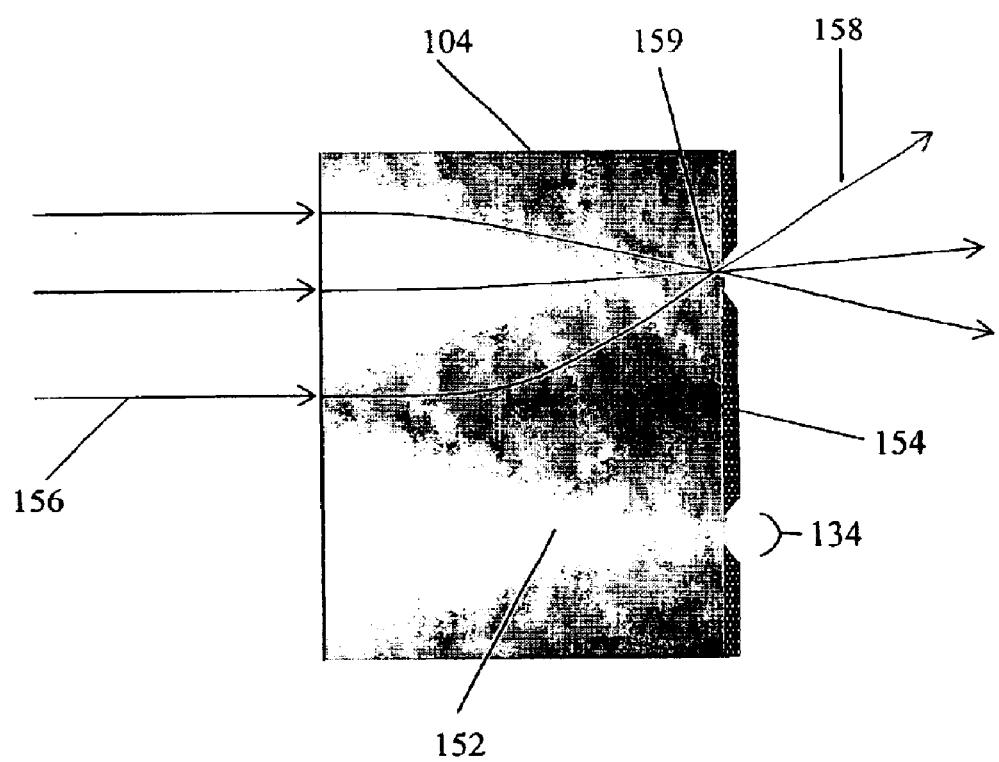
FIG. 9 illustrates cells from a light diverging part.

The examples described up to this point have assumed the use of light guide structures in which there is a discontinuous boundary between the high index tapered light guides 133 and low index side walls 132. However, structures in which the index boundary between the two regions is graded may used to create light convergence. A method for producing such structures is described in U.S. Pat. No. 4,712,854. FIG. 9 illustrates cells 152 from the light diverging part 104. In FIG. 9, areas of higher refractive index are lightly shaded while areas of lower refractive index areas are darkly shaded. The grading of refractive index in the cells 152 causes entering light rays 156 to be refract such that the light is concentrated in small areas 159 near the output surfaces of the cells 152. A decorative coating 154 is deposited on the light diverging part 104 with small apertures 134 corresponding to the areas of light concentration 159. Divergent light rays 158 exit the sheet.

Figure 10:
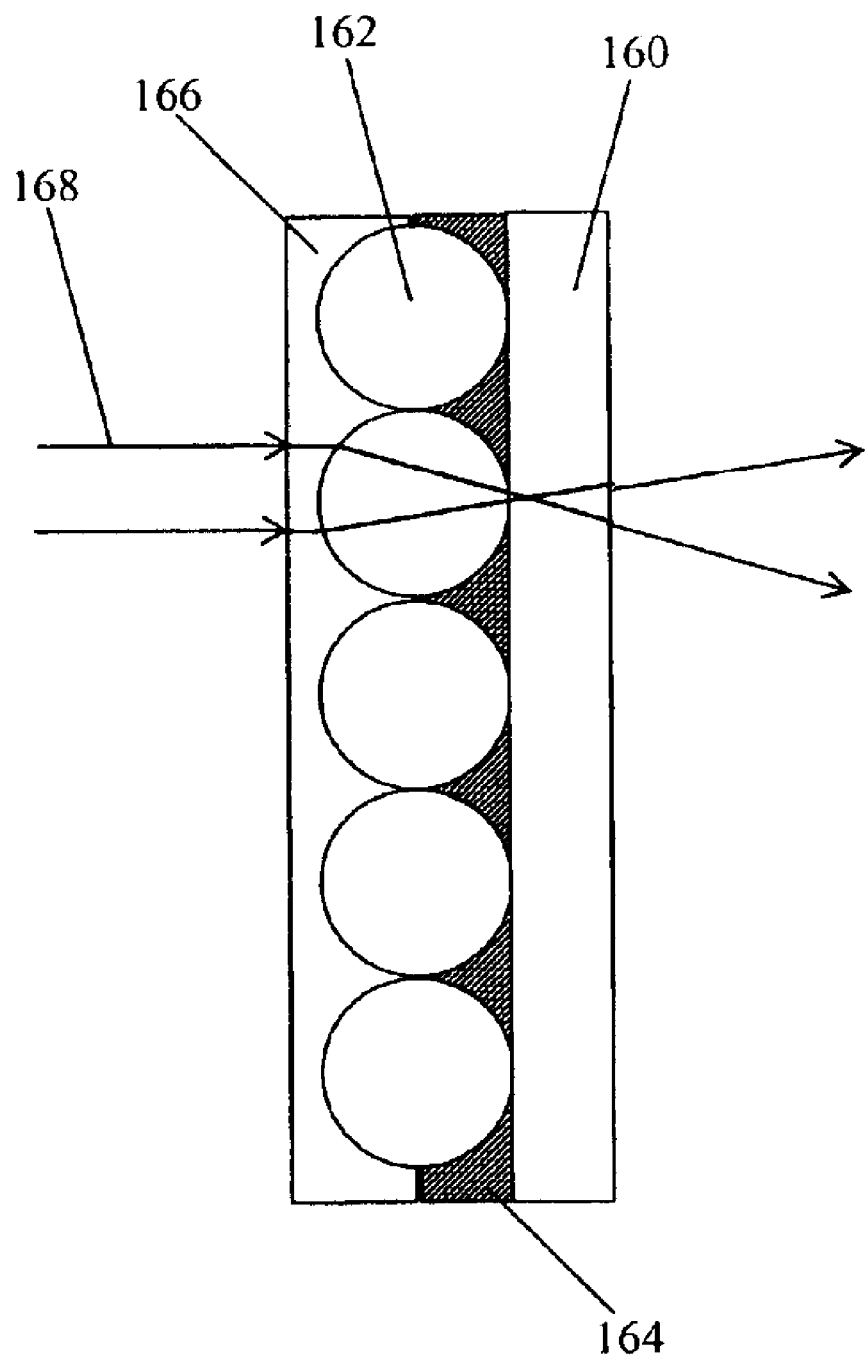
FIG. 10 illustrates an exemplary combination of microspheres and a decorative part.

Alternatively, the light diverging part 104 may contain an array of microlenses. The microlenses may be microspheres 162 such as described in U.S. Pat. Nos. 2,378,252, 3,552, 822, and 5,563,738. An exemplary combination of microspheres 162 and a decorative part is illustrated in FIG. 10. The microspheres 162 may be adhered to a transparent support film 160 using a colored or colorable decorative resin 164 that forms the decorative part. A clear, low refractive index resin may be applied as a planarization layer 166 over the microspheres 162 and provides the input surface for the light rays 168 emanating from the light generation part 102. Since the light rays 168 may be collimated or substantially collimated, the planarization layer 166 helps to couple light rays 168 into the microspheres 162. The microspheres 162 act as convex lenses that focus the light rays 168 through the small area where the microspheres 162 are in contact with the transparent support film 160. The part of the small area in contact with the transparent support film 162 forms the apertures 134.

Figure 11:
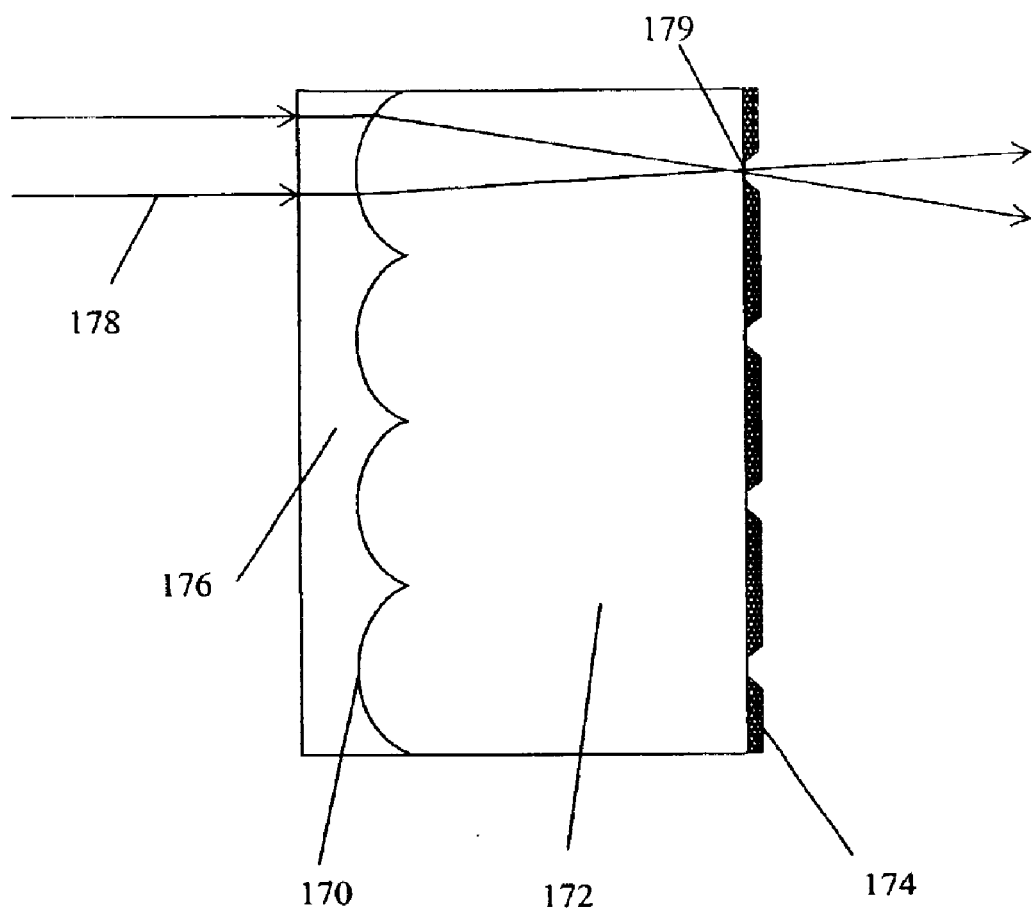
FIG. 11 illustrates a combination of a light diverging part and decoration including convex lenses on the input surface of a sheet of clear material.

An array of convex microlenses may be fabricated as is described in U.S. Pat. Nos. 2,351,034, 2,310,790 2,951,419, 5,362,351, 6,124,974, and Reissue 19,070. FIG. 11 illustrates an example of a combination of a light diverging part 104 and decoration including convex lenses 170 on the input surface of a sheet of clear material 172. These lenses 170 focus the incoming light 178 at points 179 at or near the output surface of sheet 172 and may be fabricated by an embossing or other suitable process. Colored decorative material 174 may be formed on the output surface of sheet 172 with apertures 134 registered to the points 179. The light diverging part 104 also may have a low refractive index overcoat layer 176 on the input surface. Alternatively, overcoat layer 176 may be air.

Figure 12:
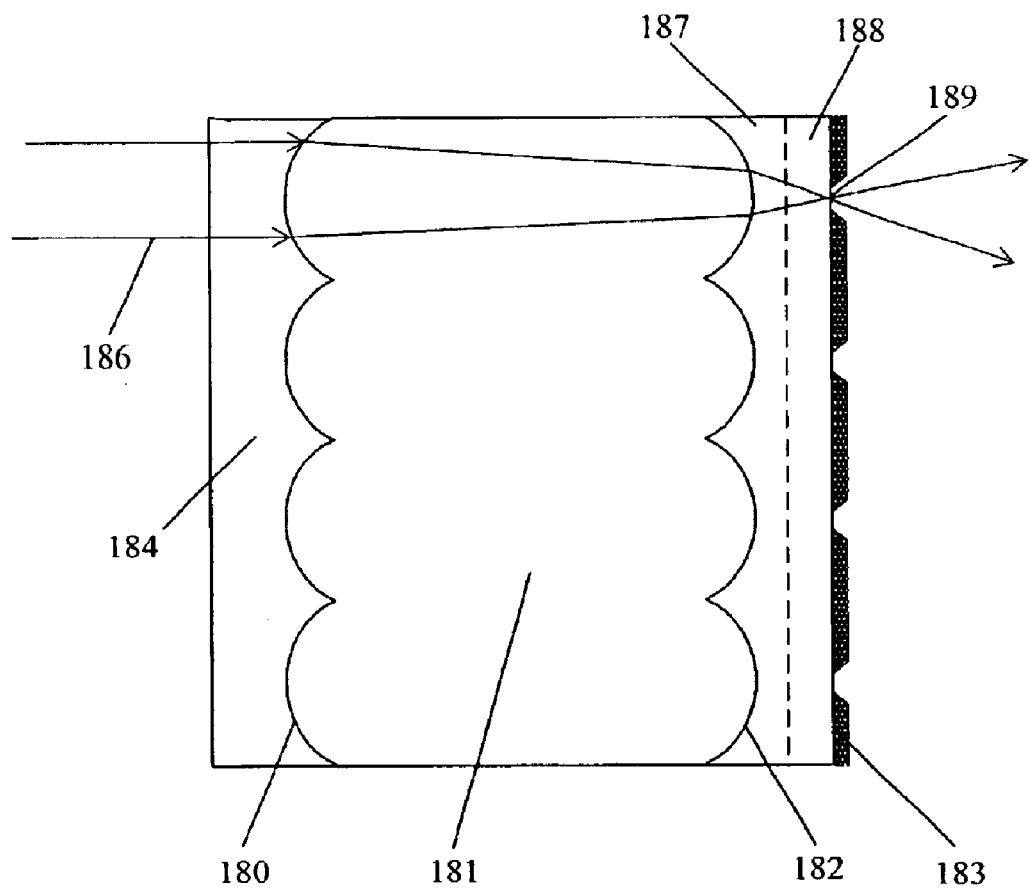
FIG. 12 illustrates another exemplary embodiment including input and output lenses formed on both the input and output surfaces of a light diverging part.

FIG. 12 illustrates another exemplary embodiment including input and output lenses 180, 182 formed on both its input and output surfaces. The lenses 180, 182 are formed on both the input and output surfaces of a transparent sheet 181. The lenses 180, 182 may be configured such that their combined affect is to focus incoming light rays 186 to points 189. Transparent layers 187, 188 may be built up over lenses 182 so that the points 189 are on or proximate to the output surface of transparent layer 188. A colored decorative material 183 may be formed on the output surface of the transparent layer 188 with apertures registered to the points 189. The transparent layer 187 may be a transparent, low birefringence material, air or any other suitable material. The transparent layer 188 may be a backing material for decorative material 183 and may be formed of the same low birefringence material as the transparent layer 187. The light diverging part 104 also may have a low refractive index overcoat layer 184 on the input surface. Alternatively, layer 184 may be an air layer.

Alternatively, Fresnel zone plates, surface or volume holographic lenses, or other lens equivalent optical components may be substituted for the lenses 170, 180, 182.

Figure 13:
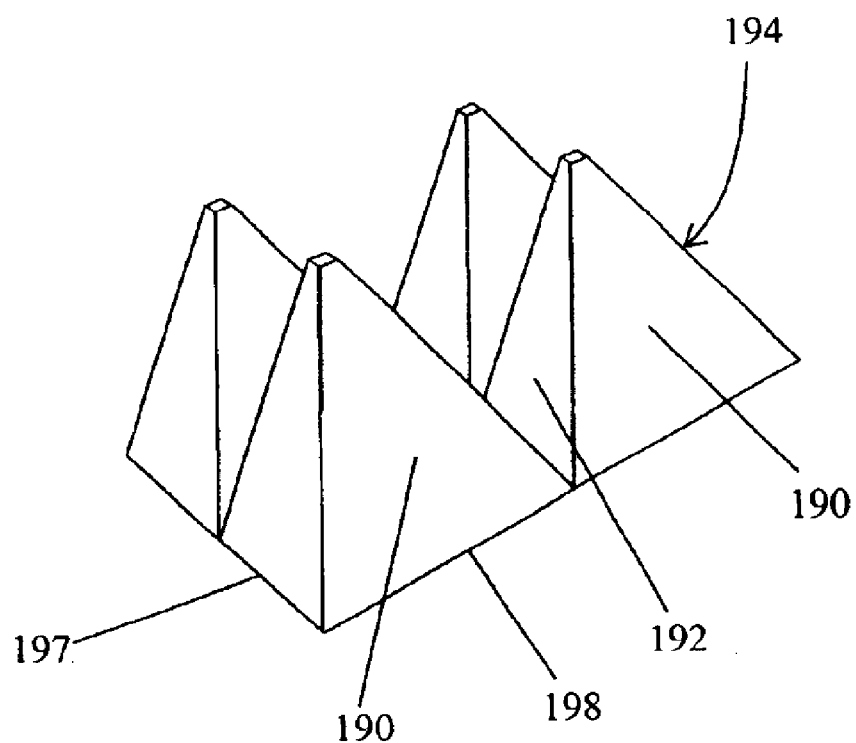
FIG. 13 illustrates a light converging element.

The closed geometric FIG. 503 that define the microscopic cells 502 of FIG. 2 may be elongated along either the width axis or length axis or some other axis in the plane of the light diverging part 104 such that light is not symmetrically focused to point or small area 506. The result will be that cone of light emerging from the light diverging part 104 will be wider along one axis than the other. The point or small area 506 need not be centered on the perpendicular projection of geometric FIG. 503 on output surface 507. The result of this asymmetry will be to displace center of symmetry of the output cone of light away from the normal to the output surface 507. The elongation of the geometric FIG. 503 and the decentering of the points 506 may be used individually or in combination to advantageously control the output distribution of light such that light from the illuminant 100 may be concentrated in desired directions and distributions. FIG. 13 illustrates an example of a light converging element that may be used for such control of light distribution. FIG. 13 includes a plurality of the micro-light pipes that may be used to form the light diverging part 104. The light pipes 190 may be symmetric or asymmetric in shape. A wall 192 of a light pipe 190 may be inclined more closely to the normal to the plane of light diverging part 104 than another wall, such as wall 194. Also, a base dimension 197 of a light pipe 190 may be shorter than another base dimension 198 of the light pipe 190.

Figure 14:
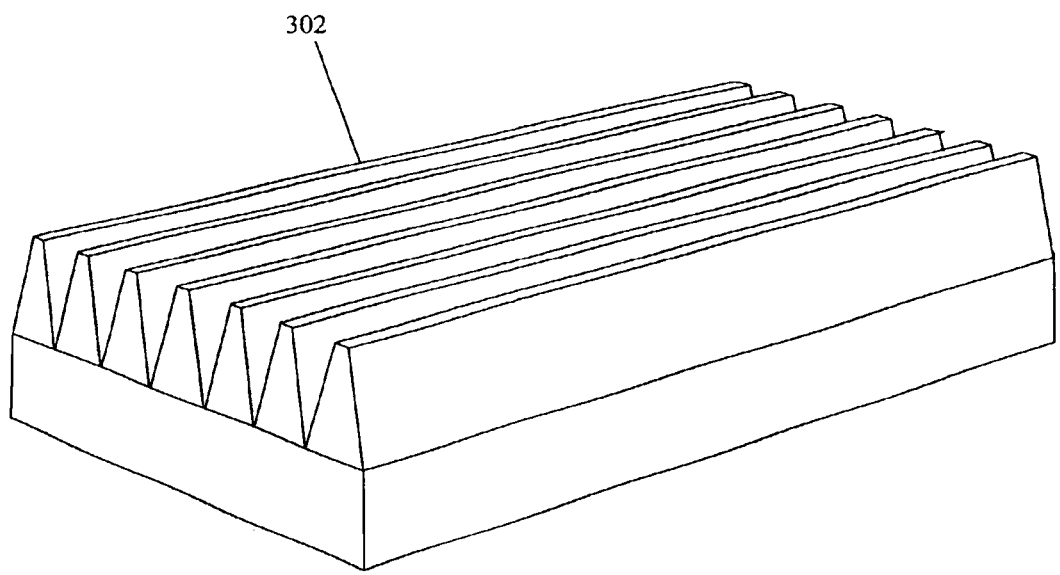
FIG. 14 illustrates light diverging part including a grating.
Figure 15:
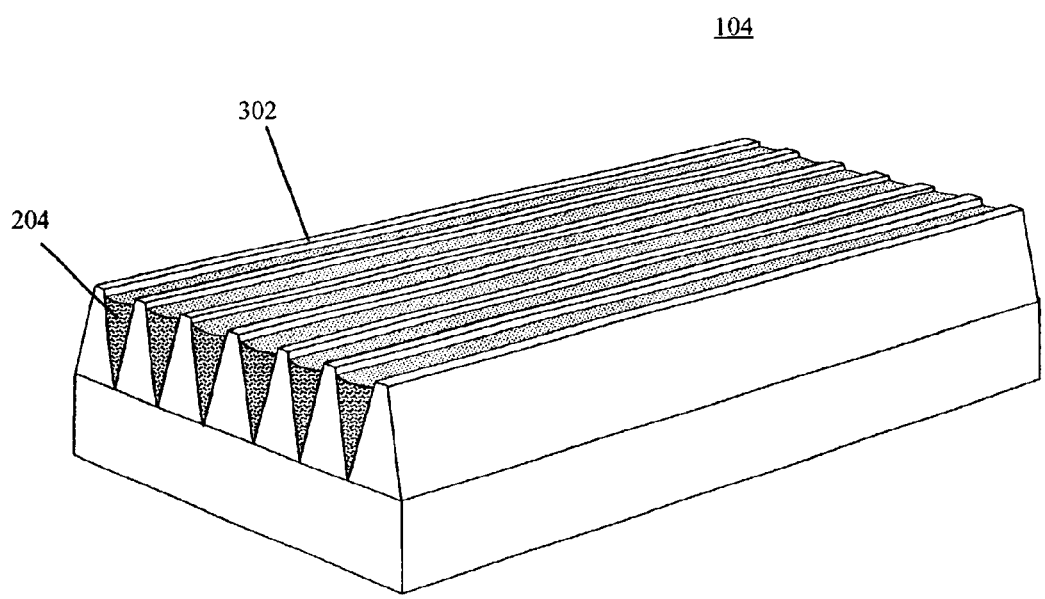
FIG. 15 illustrates the spaces between the light guides of FIG. 14 filled with a decorative material.

The elongation of the closed geometric FIG. 503 that define the microscopic cells 502 may be continued to the point that the geometric figures become tapered light guide stripes 302 running the entire length or width of the light diverging part 104. This configuration, which is also known as a grating, is illustrated in FIG. 14. The spaces between the light guides may be filled with the decorative material 204 as is illustrated in FIG. 15 and as is described above. The result is an illuminant 100 with line apertures through which the light is focused in lines rather than points.

FIG. 11 illustrates another exemplary illuminant 100 that includes a light diverging part 104 having an array of cylindrical lenses 170 running the length of input surface 504. The fabrication of such cylindrical lens arrays is described in U.S. Pat. Nos. 2,434,049 and 4,525,029.

Figure 16:
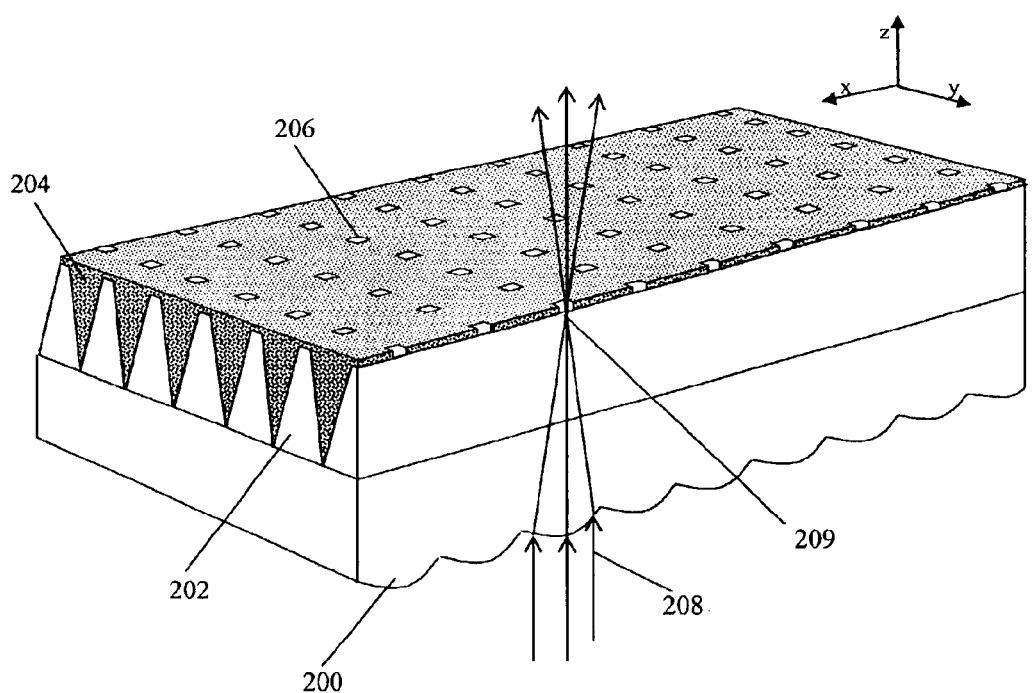
FIG. 16. illustrates another illuminant including two light diverging parts.

FIG. 16. illustrates another illuminant 100 including two light diverging parts 104. One light diverging part 104 may have a structure such as illustrated in FIG. 11 and the other light diverging part may have a structure such as illustrated in FIG. 14. In FIG. 16, film 201 has an array of cylindrical microlenses formed its input surface. The long axes of the cylindrical lenses are along coordinate axis y in the figure. The film 201 may be bonded to an array of micro-light guides 202. The micro-light guides 202 may be a light diverging part 104 such as described in FIG. 14 with their long axes along the x axis. Decorative material 204 is formed over the surface of the light guides 202. There is an array of apertures 206 in decorative material 204. The lenses 208 and light guides 202 combine to focus input light 208 at points 209 that are registered with the apertures 206.

It may be cosmetically desirable that the illuminant 100 have a transparent decorative part. This may be achieved by having the decorative material 138 be a clear, colorless resin.

The light generation part 102 may be an organic electroluminescent device that has been divided into pixels. A mixture of red, green and blue pixels or some other combination of colored pixels may constitute the pixels from which the light generation part 102 is built up. Various combinations of colored pixels may be activated to vary the color of the light emanating from the illuminant. Displays of the type described in provisional application. Ser. No. 60/379,141 may be used as the light generation part 102. In this case activating all display pixels will serve the illuminant function or alternatively the illuminant 100 may be used as an information display. Pixelated sheets of illuminants 100 of this type may be used to present video and other information at electronically chosen locations in the illuminants 100 while the remainder of the illuminants 100 serves as a light source. Such illuminants 100 may have a large size.

Any number of configurations and geometries may be used to create the light guide 132 and surface pattern configuration to produce a decorative wallpaper effect or wall decoration effect. Optionally, further processing of any of the layers to improve or add functionality may be included. For example, the viewed surface layer of the illuminant 100 may be altered by laser ablation to remove small portions of material may be performed so as to further vary the range of angles over which light is emitted from the illuminant 100. Additional layers may also be incorporated into the illuminant. For example, the illuminant 100 may be coated with a protective layer or coating and/or the illuminant may be coated with a layer that scatters light.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims

We claim:

1. An illuminant comprising: a surface pattern having a plurality of apertures; and a light guide that guides light emitted from an organic light emitting material into the plurality of apertures, wherein the light guide has a light input side for receiving light emitted from the organic light emitting material and a light output side adjacent the surface pattern for emitting light through the plurality of apertures.

2. The illuminant of claim 1, wherein the light guide is a tapered light guide.

3. The illuminant of claim 1, wherein the light guide diverges the light.

4. The illuminant of claim 1, wherein the light guide comprises microspheres.

5. The illuminate of claim 1, wherein the light guide comprises microlenses.

6. The illuminate of claim 1, wherein the light guide comprises a Fresnel zone plate or a holographic lens.

7. The illuminant of claim 1, wherein the organic light emitting element has a predetermined illumination pattern.

8. The illuminant of claim 1, wherein the organic light emitting element has an illumination pattern that may be changed.

9. The illuminant of claim 1, wherein the surface pattern is a wallpaper pattern.

10. The illuminant of claim 1, wherein the surface pattern is an architectural decoration.

11. The illuminant of claim 1, wherein the light guide includes a colored material that forms the surface pattern.

12. The illuminant of claim 1, wherein the light guide is adjacent a colored material.

13. The illuminant of claim 1, wherein the surface pattern includes a clear resin.

14. An illuminant comprising:
   a surface pattern having a plurality of apertures; and
   a light guide that guides light emitted from a light source into the plurality of apertures,
   wherein the light guide has a light input side for receiving light emitted from the light source and a light output side adjacent the surface pattern for emitting light through the plurality of apertures.

15. The illuminant of claim 14, wherein the light guide is a tapered light guide.

16. The illuminant of claim 14, wherein the light guide diverges the light.

17. The illuminant of claim 14, wherein the light guide comprises microspheres.

18. The illuminate of claim 14, wherein the light guide comprises microlenses.

19. The illuminant of claim 14, wherein the light emitting element has a predetermined illumination pattern.

20. The illuminant of claim 14, wherein the light emitting element has an illumination pattern that may be changed.

21. The illuminant of claim 14, wherein the surface pattern is a wallpaper pattern.

22. The illuminant of claim 14, wherein the surface pattern is an architectural decoration.

23. The illuminant of claim 14, wherein the light guide includes a colored material that forms the surface pattern.

24. The illuminant of claim 14, wherein the light guide is adjacent a colored material.

25. An illuminant comprising:
   a light source;
   a sheet of material operable to receive light from the light source, the sheet having at least a plurality of light guides and a surface area;
   a plurality of apertures on the surface area of the sheet, the plurality of light guides operable to guide the received light towards the plurality of apertures; and
   a plurality of decorative areas on parts of the surface of the sheet where the apertures are not present.

26. The illuminant of claim 25, wherein the light source is attached behind the sheet.

27. The illuminant of claim 25, wherein the light source is organic light emitting diode.

28. The illuminant of claim 25, wherein the plurality of light guides includes a plurality of microscopic light guides.

29. The illuminant of claim 25, wherein the plurality of decorative areas are located on parts of the surface where substantially no light is emitted.

30. The illuminant of claim 25, wherein the surface has a rough surface pattern.

31. The illuminant of claim 25, wherein the surface has a non-uniform surface pattern.

* * * * *